(12) United States Patent
Akasaka et al.

(10) Patent No.: US 7,807,944 B2
(45) Date of Patent: Oct. 5, 2010

(54) LASER PROCESSING DEVICE, PROCESSING METHOD, AND METHOD OF PRODUCING CIRCUIT SUBSTRATE USING THE METHOD

(75) Inventors: Akira Akasaka, Tokyo (JP); Toshifumi Ito, Tokyo (JP); Kikuo Takahashi, Tokyo (JP)

(73) Assignee: TDK Corporation, Tokyo (JP)

( * ) Notice: Subject to any disclaimer, the term of this patent is extended or adjusted under 35 U.S.C. 154(b) by 916 days.

(21) Appl. No.: 10/523,392

(22) PCT Filed: Aug. 7, 2003

(86) PCT No.: PCT/JP03/10052

§ 371 (c)(1),
(2), (4) Date: Feb. 3, 2005

(87) PCT Pub. No.: WO2004/014595

PCT Pub. Date: Feb. 19, 2004

(65) Prior Publication Data

US 2005/0232316 A1    Oct. 20, 2005

(30) Foreign Application Priority Data

Aug. 9, 2002    (JP) ............................ 2002-232609

(51) Int. Cl.
*B23K 26/00* (2006.01)
(52) U.S. Cl. .............................. 219/121.71; 219/121.7
(58) Field of Classification Search ............ 219/121.71, 219/121.7, 121.85, 121.6, 121.61
See application file for complete search history.

(56) References Cited

U.S. PATENT DOCUMENTS

| | | | | |
|---|---|---|---|---|
| 4,931,616 A * | 6/1990 | Usui et al. | ............. | 219/121.68 |
| 5,523,543 A * | 6/1996 | Hunter et al. | .......... | 219/121.62 |
| 5,837,961 A * | 11/1998 | Miller | .................... | 219/121.68 |
| 5,948,219 A * | 9/1999 | Rohner | .................... | 204/224 R |
| 6,028,288 A * | 2/2000 | Moriike | ................. | 219/121.69 |
| 6,156,030 A * | 12/2000 | Neev | ........................... | 606/10 |
| 6,313,435 B1 * | 11/2001 | Shoemaker et al. | ...... | 219/121.7 |
| 6,373,026 B1 * | 4/2002 | Kurosawa et al. | ...... | 219/121.72 |
| 6,531,677 B2 * | 3/2003 | Arai et al. | ............. | 219/121.71 |
| 6,621,044 B2 * | 9/2003 | Jain et al. | ................ | 219/121.7 |

(Continued)

FOREIGN PATENT DOCUMENTS

EP    1043110    10/2000

(Continued)

*Primary Examiner*—M. Alexandra Elve
(74) *Attorney, Agent, or Firm*—Oblon, Spivak, McClelland, Maier & Neustadt, L.L.P.

(57) ABSTRACT

A laser processing apparatus for performing processing such as perforation on a ceramic green sheet etc. using a laser beam efficiently. The laser processing apparatus is provided with a plurality of optical path systems disposed between a laser oscillator and an irradiation position control optical system for irradiating a predetermined position on a work piece with a laser beam. The plurality of optical path systems includes an optical path system that guides the laser beam to the irradiation position control optical system without changing its cross sectional shape in the direction perpendicular to the optical axis of the laser beam and an optical path system that guides the laser beam while changing its cross sectional shape so that these optical path systems are selectively used in accordance with the processing condition.

6 Claims, 5 Drawing Sheets

U.S. PATENT DOCUMENTS

| | | | |
|---|---|---|---|
| 6,649,864 B2 * | 11/2003 | De Steur et al. | 219/121.71 |
| 2002/0040893 A1 * | 4/2002 | Arai et al. | 219/121.71 |
| 2003/0116545 A1 * | 6/2003 | Kaji | 219/121.72 |

FOREIGN PATENT DOCUMENTS

| | | |
|---|---|---|
| JP | 1-99793 | 4/1989 |
| JP | 5-8072 | 1/1993 |
| JP | 7-331422 | 12/1995 |
| JP | 9-164493 | 6/1997 |
| JP | 10-137959 | 5/1998 |
| JP | 10-323788 | 12/1998 |
| JP | 11-47965 | 2/1999 |
| JP | 11-147188 | 6/1999 |
| JP | 2000-280085 | 10/2000 |
| JP | 2001-105166 | 4/2001 |
| JP | 2002-96187 | 4/2002 |
| JP | 2002-096187 | 4/2002 |
| JP | 2002-217550 | 8/2002 |

* cited by examiner

LASER PROCESSING DEVICE, PROCESSING METHOD, AND METHOD OF PRODUCING CIRCUIT SUBSTRATE USING THE METHOD

TECHNICAL FIELD

The present invention relates to a processing apparatus and processing method for performing a processing such as perforation or cutting on a work piece using a laser beam. More particularly, the present invention relates to a perforation apparatus and perforation method for efficiently perforating a so-called ceramic green sheet made of a ceramic and a method for manufacturing a circuit board by processing the green sheet.

BACKGROUND ART

Circuit boards made of a ceramic have superior heat-resisting quality and durability as compared to general resin boards, and their use in, for example, personal digital assistants have been increasing. On the other hand, with a view to increase packing densities, cases in which functions as a circuit are added to ceramic boards and such boards are stacked to be used as a multilayer board have also been increasing. The green sheet is a common name for a ceramic etc. before sintering, and the board is generally subjected to processing such as perforation for forming multilayer wiring in the green sheet state.

Use of a laser beam in perforation or other processing has been increasing in view of the processing rate achieved or the facility in changing the shape of the processed hole or in view of easiness in forming a hole with a high circularity. In the following, a conventional apparatus for perforating various work pieces, especially ceramic green sheets using a laser beam will be briefly described with reference to FIG. 6.

Figure 6:
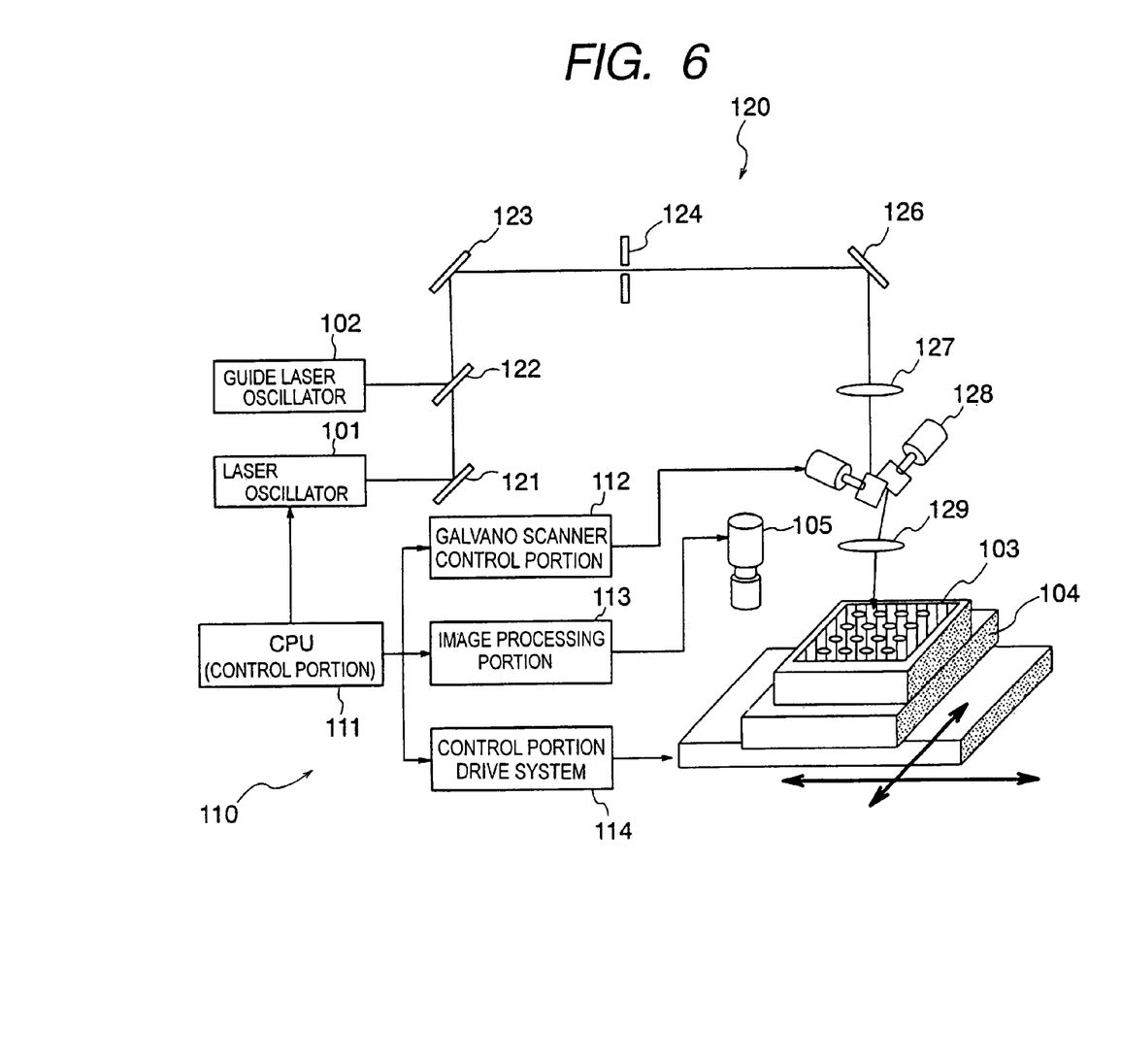
FIG. 6 schematically shows the basic structure of a conventional laser perforating apparatus.

This apparatus includes a laser oscillator 101 for generating a laser beam used for processing, a guide laser oscillation apparatus 102 for generating a guide laser beam, an optical system 120 for shaping the guide laser beam and the processing laser beam and guiding them to a predetermined position on a work piece 103, an XY stage 104 for moving the work piece 103 placed on it in the X and Y directions, a camera 105 for capturing the shape of the guide laser incident on the work piece 103 or the shape of a processed hole etc. as an image and used for positioning of the work piece, and a control system 110 for driving these components. The guide laser (for example, red light) is projected onto the work piece previously, so that correction of the position at which the laser for actual processing is projected or correction of the shape of the laser is effected based on the projection position and shape of the guide laser.

The optical system 120 is composed of total reflection mirrors 121, 123, 126, a dichroic mirror 122, a mask 124, a collimator lens 127, an XY galvano scanner mirror 128 and an fθ lens 129. The laser beam emitted from the laser oscillator 101 is deflected by the total reflection mirror 127 so as to be directed toward the dichroic mirror 122, and transmitted through the dichroic mirror 122 from its back side. Then, the laser beam is deflected again by the total reflection mirror 123 so as to be directed toward the mask 124. The guide laser beam emitted from the guide laser oscillator 102 is deflected by the dichroic mirror 122 so as to travel on the same optical path as the processing laser beam.

The processing laser beam and the guide laser beam pass through the opening 124a of the mask 124, whereby they are shaped into a form corresponding to a hole to be formed such as a approximately circular form etc. The laser beam after transmitted (passing) through the mask is a little divergent, and it is necessary to reshape it into parallel light using a collimator lens or the like. For this purpose, the laser beam after shaping is deflected by the total reflection mirror 126 so as to enter the collimator lens 127. The irradiation position of the laser beam having been made into parallel light by the collimator lens 127 is moved by the XY galvano scanner mirror 128 and the fθ lens 129 in such a way that it is delivered to a desired processing position on the work piece 103. The XY galvano scanner mirror 128 and the fθ lens 129 function together as an irradiation position control optical system for the laser beam.

The control system 110 is composed of a galvano scanner control portion 112, an image processing portion 113, a drive control portion 114 and a main control portion for controlling these portions and controlling the laser oscillator etc. in synchronization with the control by these portions. The galvano scanner control portion 112 is connected with the XY galvano scanner mirror 128 to control the irradiation position of the laser beam by controlling the XY galvano scanner mirror 128. The image processing portion 113 is connected with the camera 105. The image processing portion 113 monitors the condition, position and degree of accuracy of the processed hole based on an image obtained through the camera 105 and outputs information on the number of pulses and intensity of the laser beam to the main control portion. The drive control portion 114 drives the XY stage 104 to change the position of the work piece 103 in such a way that the position on the work piece at which a hole is to be made comes into the area that can be irradiated by the laser beam controlled by the galvano scanner mirror. This apparatus is constructed in such a way that the shape of the mask 124 is projected onto the surface of the work piece 103 at a desired reduction ratio, and a processed hole with a nearly circular shape and having little taper in its cross section is obtained.

In the above-described conventional apparatus, a large part of the laser beam is blocked by the mask 124, and only the portion that have passed through the opening 124a of the mask is used for actual processing. Accordingly, the utilization efficiency of the laser beam is not so high, and it is required to use an oscillator having a relatively large output power as the laser oscillator 101 in view of the aforementioned blocking. It is considered that the utilization efficiency of the laser affects the processing efficiency greatly especially in the case that the surface layer is made of a material having a relatively low absorption efficiency for the laser beam. In this case, the number of pulses of the laser required for processing is very large, which results in a large decrease in the processing efficiency.

DISCLOSURE OF THE INVENTION

The present invention has been made in view of the above-described problems. An object of the present invention is to improve the utilization efficiency of the laser beam and to enhance the processing efficiency even for work pieces with a surface made of a material that is hard to process, to provide a laser processing apparatus and a processing method with which a desired processed shape can be easily achieved. Another object of the present invention is to provide a method for manufacturing a circuit board in which processing such as perforation is applied on a ceramic green sheet using the aforementioned method.

To solve the above-described problems, according to the present invention, there is provided a laser processing apparatus for irradiating a work piece with a laser beam to process the irradiated portion comprising a laser oscillator for generating the laser beam, an irradiation position control optical system for causing the laser beam to irradiate a predetermined position on the work piece, and a plurality of optical path systems for guiding the laser beam emitted from the laser oscillator to the irradiation position controlling optical system, wherein the plurality of optical path systems includes at least a first optical path system that guides the laser beam emitted from the laser oscillator to the irradiation position control optical system without changing the energy distribution in the direction perpendicular to the optical axis of the laser beam and a second optical path system that guides the laser beam emitted from the laser oscillator to the irradiation position control optical system while changing the energy distribution in the direction perpendicular to the optical axis of the laser beam.

To solve the above-described problems, according to the present invention there is provided a laser processing apparatus for irradiating a work piece with a laser beam to process the irradiated portion comprising a laser oscillator for generating the laser beam, an irradiation position control optical system for causing the laser beam to irradiate a predetermined position on the work piece, and a plurality of optical path systems for guiding the laser beam emitted from the laser oscillator to the irradiation position controlling optical system, wherein the plurality of optical path systems includes at least a first optical path system that guides the laser beam emitted from the laser oscillator to the irradiation position control optical system without changing the energy intensity of the laser beam and a second optical path system that changes the energy distribution in the direction perpendicular to the optical axis thereof by preventing a portion of the laser beam emitted from the laser oscillator from reaching the irradiation position control optical system.

The above-described apparatus may include optical path switching means for switching the optical path that is used in guiding the laser beam, and the switching of the optical path systems may be performed during an off-time of the pulse irradiation of the laser beam. Furthermore, in the above-described apparatus, the second optical path system that changes the energy distribution of the laser beam may include a mask or homogenizer or a combination of them that makes the energy distribution in the direction perpendicular to the optical axis of the laser beam substantially uniform.

To solver the above-mentioned problems, according to the present invention, there is provided a laser processing method for irradiating a work piece with a laser beam to process the irradiated portion, comprising a first processing step of irradiating a predetermined position on the work piece with a laser beam emitted from a laser oscillator without changing its energy distribution in the direction perpendicular to the optical axis of the laser beam, a laser beam switching step of stopping the irradiation with the laser beam that is not changed in its energy distribution and guiding a laser beam that is formed by changing the energy distribution in the direction perpendicular to the optical axis, of the laser beam emitted from the laser oscillator to the predetermined position on the work piece, and a second processing step of performing irradiation with the laser beam that has been changed in the energy distribution.

In the above-described method, it is preferable that the laser beam switching step be performed during an off-time of the pulse irradiation of the laser beam emitted from the laser oscillator. It is also preferable that the energy intensity distribution of the laser beam that has been changed in the energy distribution guided onto the work piece be made uniform.

To solve the above-mentioned problems, according to the present invention, there is provided a method of manufacturing a circuit board comprising a step of performing a perforation processing on a ceramic green sheet and a step of filling the hole formed with an electrode material, the perforation processing comprising a first processing step of irradiating a predetermined position on the ceramic green sheet with a laser beam emitted from a laser oscillator without changing its energy distribution in the direction perpendicular to the optical axis of the laser beam, a laser beam switching step of stopping the irradiation with the laser beam that is not changed in its energy distribution and guiding a laser beam that is formed by changing the energy distribution in the direction perpendicular to the optical axis, of the laser beam emitted from the laser oscillator to the predetermined position on the work piece and a second processing step of performing irradiation with the laser beam that has been changed in the energy distribution.

THE BEST MODE FOR CARRYING OUT THE INVENTION

Figure 1:
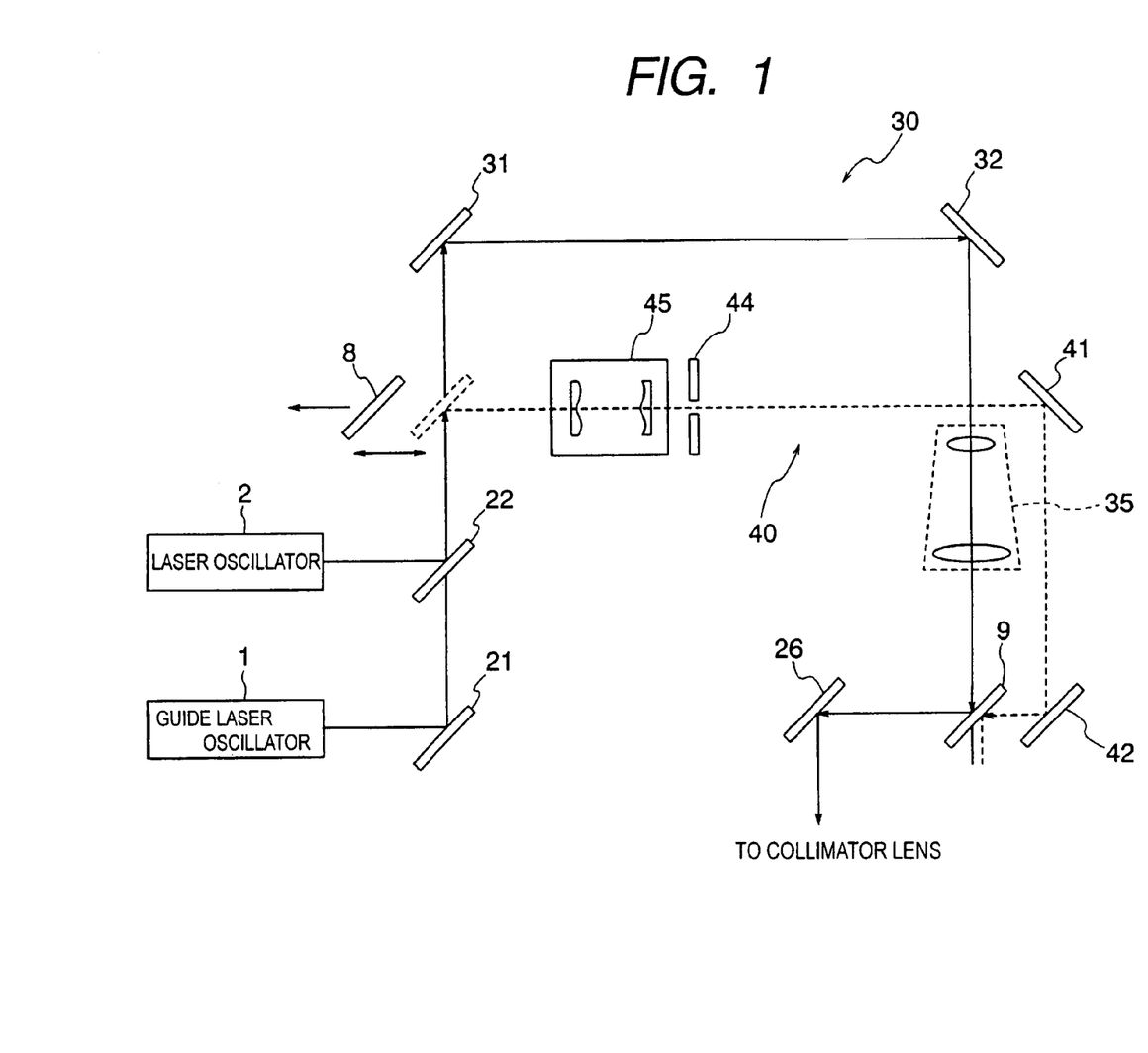
FIG. 1 schematically shows the basic structure of a laser processing apparatus according to an embodiment of the present invention.

A laser processing apparatus according to an embodiment of the present invention will be described in detail with reference to the drawings. In this apparatus, the portions other than the optical system, namely the laser oscillator, the guide laser oscillator, the XY stage and the control portions etc. are not particularly different from those in the conventional apparatus, and the following description will be mainly directed to the optical system. FIG. 1 shows the outline of the optical system in the processing apparatus according to the present invention. This optical system includes total reflection mirrors 21 and 26, a dichroic mirror 22, optical path switching mirrors 8 and 9, a first optical path system 30 and a second optical path system 40.

A processing laser beam emitted from the laser oscillator 1 is deflected by the total reflection mirror 21 toward the dichroic mirror 22, transmitted through the dichroic mirror 22, and then arrives at the position of the optical path switching mirror 8. A guide laser beam emitted from the guide laser oscillator 2 is deflected by the dichroic mirror 22 so that its optical path will coincide with that of the processing laser beam. Which optical path system, among the first optical path system 30 and the second optical path system 40, the processing laser beam and the guide laser beam is made to pass is selected by the optical path switching mirror 8.

The laser beam having passed through the first or second optical path 30, 40 is reflected by the optical path switching mirror 9 toward the total reflection mirror 26, and directed by this mirror to a collimator lens that is not show in the drawings. In the downstream of the collimator lens, an XY galvano scanner mirror and other parts similar to those in the conventional apparatus are provided, and the laser beam is guided to a desired position on the work piece by those optical elements. In other words, the laser processing apparatus according to the present invention is provided with an irradiation position control optical system including the XY galvano scanner mirror etc., though they are not shown in FIG. 1.

The first optical path system 30 includes total reflection mirrors 31 and 32 and a beam expander 35. In this optical system, the laser beam arrives at the expander 35 without being blocked by any means. The irradiation diameter of the laser beam is enlarged by the expander so that a predetermined area can be irradiated with the laser beam, and then the laser beam is guided to the optical path switching mirror 9. No structure that may partially block the laser beam is disposed in the optical path of the laser beam passing through the first optical path system 30. Therefore, it is possible to make the most part of the processing laser emitted from the laser oscillator 1 to be incident on the work piece directly.

In other words, the energy intensity of the laser beam directed to the work piece through the first optical path system 30 is not reduced from the state as it was when emitted from the laser oscillator, and the energy distribution in the direction perpendicular to its optical axis (the cross sectional shape) does not vary. Accordingly, processing with high utilization efficiency can be realized. In connection with this, if the energy density of the laser beam delivered to the surface of the work piece is to be enhanced further, a condenser lens or the like may be used in place of the aforementioned beam expander. In this case also, the total energy of the laser beam in the direction perpendicular to the optical axis does not vary, and similarity of the energy distribution is also maintained basically.

Figure 2:
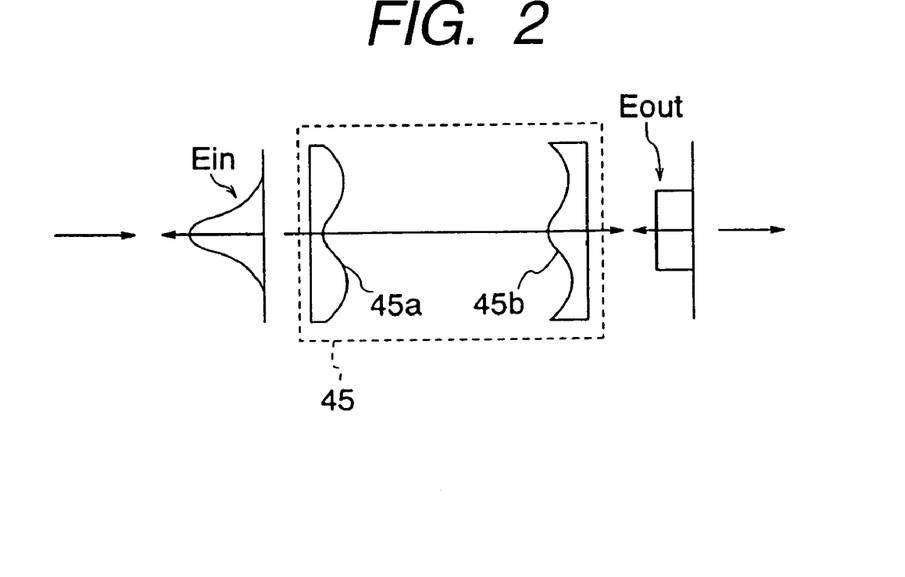
FIG. 2 schematically shows the basic structure of the second optical path system shown in FIG. 1.

The second optical path system 40 includes a homogenizer 45, a slit 44 and total reflection mirrors 41 and 42. In this optical path system, the output waveform of the laser beam is shaped by the homogenizer 45 in such a way that the energy distribution of the laser beam becomes a top-hat shape. FIG. 2 schematically shows the beam shaping effected by the homogenizer. The beam waveform (i.e. the energy distribution) shown with respect to the direction perpendicular to the traveling direction of the laser beam is of the shape indicated by Ein in FIG. 2. When the laser beam passes through two aspherical lenses 45a and 45b having certain curved surfaces included in the homogenizer 45, the laser light corresponding to the central portion of Ein is dispersed to the peripheral portions and the laser light corresponding to the peripheral portions is concentrated to the central portion. As a result, the laser beam emerging from the homogenizer 45 will have a beam shape called top-hat indicated by Eout in which an energy intensity distribution is substantially uniform all over the irradiation area. Thus, the energy distribution in the direction perpendicular to the optical axis of the laser beam having passed through the second optical path system 40 has been deformed to a large extent as compared to the distribution just after the laser beam is emitted from the oscillator.

The laser beam that has been shaped into the top-hat by the homogenizer 45 passes through a mask 44 disposed in the downstream of the homogenizer, whereby the laser beam is shaped to have a beam shape corresponding to the opening 44a. The laser beam thus shaped is guided by the total reflection mirrors 41 and 42 to the optical path switching mirror 9, and then it is guided by the total reflection mirror 26 to the collimator lens not shown in the drawings in the same manner as the laser beam having passed through the first optical path system 30. As per the above, for example in the case that a nearly circular hole is to be formed on a work piece, it is possible to produce a laser beam having a circular shape and having a uniform beam intensity in the circular area by passing the laser beam through the homogenizer 45 and the mask 44.

Figure 3:
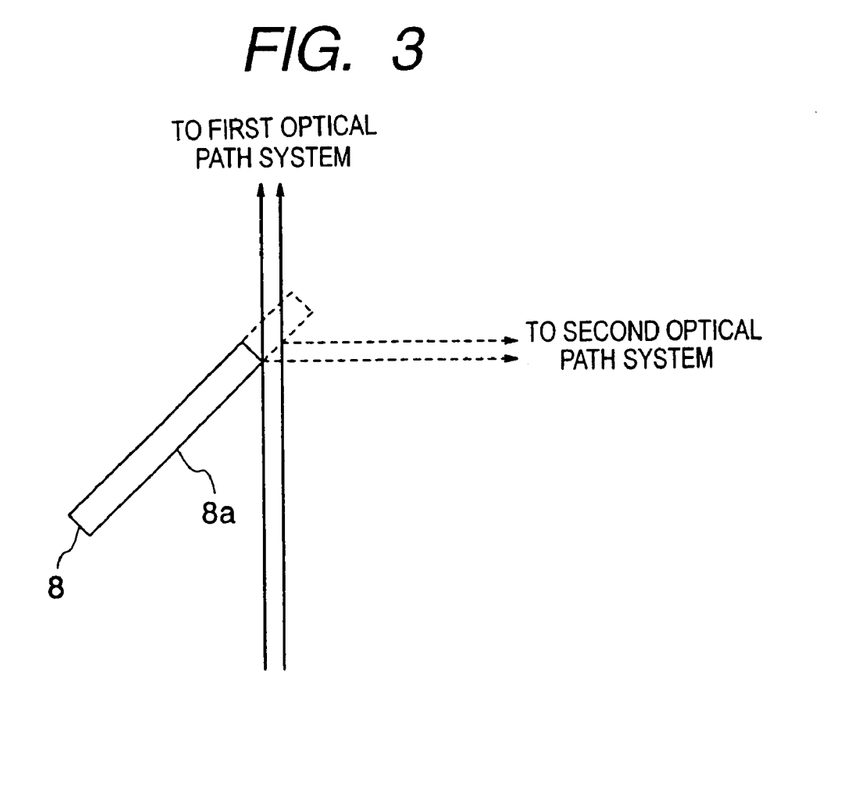
FIG. 3 illustrates the optical path switching mirror in FIG. 1.

Next, the optical path switching mirrors 8 and 9 will be described in detail with reference to FIG. 3. FIG. 3 shows the optical path switching mirror 8, and the following description will be directed only to the mirror 8, since the basic structure thereof is the same as the mirror 9. The mirror 8 is connected, at its back side end, with a drive apparatus such as a single axis drive motor and a cylinder etc. not shown in the drawings. The mirror 8 is adapted to be driven in a specific axial direction A, and it can be stopped at two positions, one of which is in the optical path of the laser beam and the other is out of the optical path. When the laser beam reflection surface 8a is out of the optical path, the laser beam is guided to the first optical path system without a change in its traveling direction. On the other hand, when the reflection surface 8a is in the optical path, the traveling direction of the laser beam is changed by the reflection surface by 90 degrees and guided to the second optical path system.

By using the laser processing apparatus having the above-described structure, it is possible to improve the utilization efficiency of the laser beam and to enhance the processing efficiency even for work pieces with a surface made of a material that is hard to process, and therefore a desired processed shape can be easily obtained. In the following, advantages of the present invention will be described in connection with a specific case in which perforation processing is performed on a work piece having the first layer that is hard to process and the second layer that is easy to process, with reference to sequential statuses in the case of the processing by the conventional apparatus shown in FIGS. 4A, 4B, 4C, 4D and 4E and sequential statuses in the case of the processing by the apparatus according to the present invention shown in FIGS. 5A, 5B, 5C, 5D and 5D.

Figure 4A:
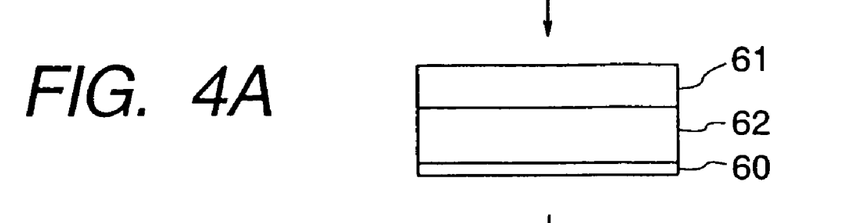
FIGS. 4A, 4B, 4C, 4D and 4E show sequential statuses of processing in the case of a conventional apparatus.
Figure 4B:
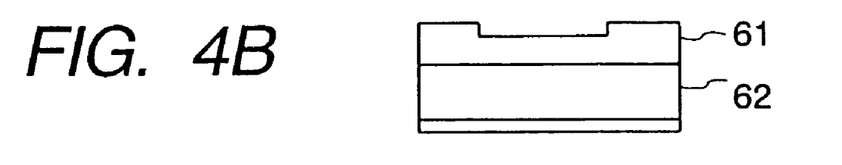
Figure 4C:
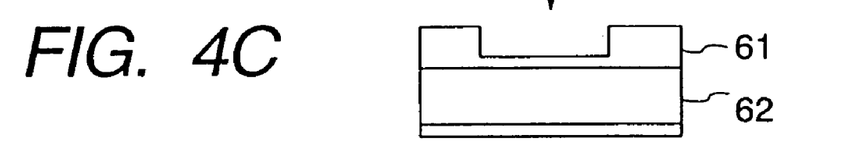
Figure 4D:
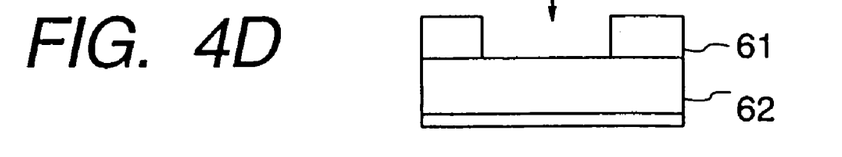
Figure 4E:
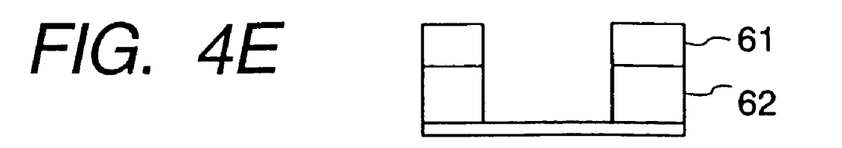

FIGS. 4A, 4B, 4C, 4D and 4E and FIGS. 5A, 5B, 5C, 5D and 5D show cases in which a hole is made on a work piece in which the second layer 62 that is easy to process and the first layer 61 that is hard to process are laminated on a base film 60 made of a PET or the like, while the base film 60 is left unprocessed. In the case that the laser beam that has been shaped by a mask or the like is used, a hole is formed in the laser beam irradiation area on the first layer 61 from its outermost surface at a substantially constant processing rate as shown in FIGS. 4B, 4C and 4D. In this case, since the energy density of the laser beam per unit irradiation area is low, the hole formation speed is low. Accordingly, the required number of pulses of the irradiation laser beam is very large. After the first layer 61 that is hard to process has been removed, the perforation processing is applied on the second layer 62 that is easy to process, as shown in FIGS. 4D and 4E, and the number of irradiation pulses can be made small.

Figure 5A:
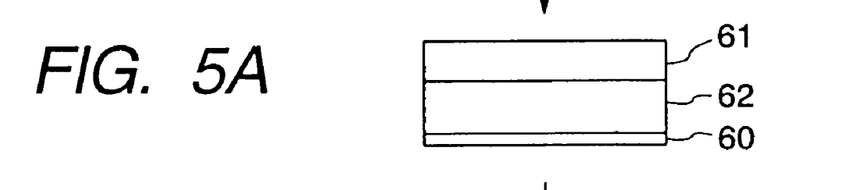
FIGS. 5A, 5B, 5C, 5D and 5E show sequential statuses of processing in the case of an apparatus according to the present invention.
Figure 5B:
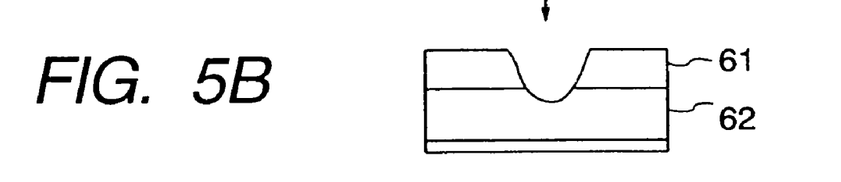
Figure 5C:
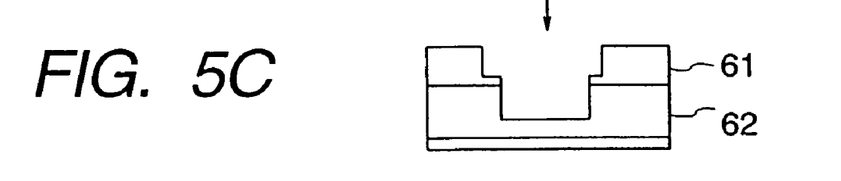

In the case that the laser processing apparatus according to the present invention is used, the surface of the first layer 61 is firstly irradiated with the laser beam having passed through the first optical path system. In this case, the laser beam is delivered to the surface of the work piece while having, for example, a Gaussian distribution in which the energy density is high at its center without a loss in its energy. Accordingly, a hole is formed rapidly at the substantially central portion of the laser beam irradiation area as shown in FIG. 5B. However, the laser beam used has not been subjected to any shaping process as to its shape and energy distribution etc. Therefore, if the processing is further performed with this laser beam, it is difficult to produce a hole with a desired shape. In view of this, at the time when a part of the first layer 61 is thoroughly removed and a portion of the second layer 62 is exposed in the laser beam irradiation area, the laser beam used is switched to the laser beam having passed through the second optical path system that has been shaped and rendered uniform (FIG. 5C). The switching operation is effected by the optical path switching mirrors 8 and 9.

Figure 5D:
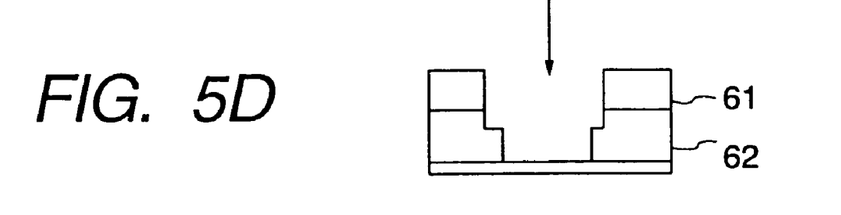
Figure 5E:
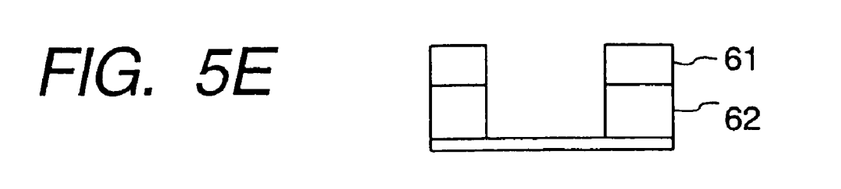

At the time when the laser beam is switched, the first layer 61 that is hard to process still remains in the laser irradiation area to some extent. Accordingly, after the laser beam has been switched, the processing rate differs between in the vicinity of the outer periphery of the irradiation area and in the vicinity of the center, and the cross sectional shape of the hole made is tapered as shown in FIG. 5C or 5D. However, the taper can be eliminated by optimizing the number of pulses of the irradiation laser beam etc. to terminate the perforation processing at the base film 60 and removing the vicinity of the periphery of the irradiation area by subsequent laser beam irradiation.

With the above-described process shown in FIGS. 5A, 5B, 5C and 5D, it is possible to make a hole without a taper in its cross section similar to the hole shown in FIG. 4D produced by the conventional apparatus. In addition, by carrying out the present invention, it is possible to reduce the time taken from the surface of the first layer 61 is irradiated with the laser beam until the laser beam reaches the second layer. Thus, the productivity of the laser processing apparatus can be enhanced. Furthermore, even if the processing rate with the laser beam having passed through the second optical path is decreased for example with adaptation of this laser beam to more precise shapes etc., it is possible to make a hole such as one having a nearly circular opening with an improved precision at a rate equal to or more than in the case of the conventional apparatus, since the processing rate is increased by the laser beam having passed through the first optical path system.

The multilayer structure described heretofore includes, for example, a structure in which a metal electrode layer is formed on the outermost processed surface and a ferrite-based or alumina-base ceramic layer is formed under it. It is considered that the present invention is effectively applied to the case where perforation processing is applied to a sheet made of a single layer of an alumina-based ceramic that is considered to be hard to process with a laser beam. In this case also, it is preferable to form a hole on the sheet using the laser beam having passed through the first optical path system and to subsequently shape the hole using the laser beam having passed through the second optical path system by following the process similar to the process of switching the optical path described in the foregoing.

In the above description of the embodiment, parameters related to the processing conditions such as the energy density, the irradiation time and the number of pulses of the laser beam have not been described for the sake of simplicity of the description. However, by controlling these parameters in addition to the switching of the optical path system, it is possible to form a hole having a desired depth or a tapered shape. The present invention is considered to be effective especially in the case that the energy or the pulse energy of the laser emitted from the oscillator is low, and the invention is especially effective in the case that a high-order harmonics laser of the UV range is used as well as in the case of a $CO_2$ laser or a YAG laser is used.

Although in this embodiment a homogenizer 25 serving as a beam shaping element is provided between the optical path switching mirror 8 and the mask 44, it may be eliminated if the range of the variation of the energy distribution in the irradiation area meets a desired level. In this embodiment, with the provision of this element, processing using a laser beam having an improved top-hat energy distribution is made possible, and it is possible to form a hole with little taper in its shape. Holes having such a shape are suitable for the case where perforation processing is applied to a sheet with the ceramic portion having a thickness of 30μ or less, or in the case where a hole formed is to be filled with an electrode material or the like and the viscosity of the filler paste is as small as 50 Pa·s or less.

Furthermore, it is possible to form a desired beam by changing the curvature, refractive index or other factors of the aspherical lenses that constitutes the homogenizer. Therefore, it is also possible to control the taper in cross section of the processed hole by preparing multiple types of homogenizers in advance and setting them on the optical axis as needed. Such holes the taper of which are controlled are suitable for the case where the diameter of the hole relative to the thickness of the green sheet (or the aspect ratio) is large or in the case where a hole formed is to be filled with an electrode material or the like and the viscosity of the filler paste is as large as 200 Pa·s or more.

In the above-described embodiment, a total reflection mirror are used for switching of the optical path. In this switching method, it is preferable that the mirror be moved at a speed synchronized with the laser irradiation pulse. Specifically, it is preferable that the mirror be driven in response to the off-state of the laser beam in the pulse irradiation at such a speed that the movement of the mirror into or out of the optical path is completed during the off-state or off-time. In this case, it is more preferable that the apparatus be constructed in such a way that the mirror or the like is driven in some correlation with the pulse, for example, in such a way that the mirror is driven in synchronization with the moment at which the laser irradiation changes to the off-state or that the driving of the mirror is completed a predetermined time before the laser irradiation changes to the on-state. This enables continuous switching of the optical path and realizes an improvement in the processing efficiency.

Although in the above-described embodiment, a mirror that moves along one axis is used for switching the optical path, this feature is not essential to the invention. The switching of the optical path may be carried out, for example, by providing a so-called chopper having a disk-like shape in which surfaces with a mirror and surfaces without a mirror are alternately disposed and rotating it. Alternatively, the switching of the optical path may be done by providing a half mirror that transmits 50% of the light quantity in place of the total reflection mirror and providing shutters or the like in the respective optical paths in the downstream of the half mirror, and opening/closing the shutters. The speed of opening/closing of the shutters can be made higher than the speed of the direct driving of the mirror, and therefore more speedy switching of the optical path can be made possible. In addition, in this case, by changing the ratio of the reflection and transmission of the half mirror in a desired manner, it is possible to perform processing such as perforation in a condition more suitable for the characteristics of the work piece.

Although there are two optical path systems in the above-described embodiment, the present invention is not limited to this feature, but an additional optical path system may be introduced. In connection with this, for example, an optical path system similar to the first optical path system but having no expander may be added. With this optical path system, a laser beam having a higher energy intensity in the central portion of the laser beam irradiation area can be produced. Alternatively, an optical path system similar to the second optical path system that is modified to be able to produce a laser beam in which the energy intensity in the vicinity of the periphery of the laser beam irradiation area is enhanced by means of a homogenizer may be added. Alternatively, a plurality of optical path system corresponding to different beam shapes may be provided so that a desired optical path is selected from them in accordance with the characteristics of the work piece or the required processed shape etc.

In the above-described embodiment, the processing using the second optical path system is effected after completion of the perforation processing using the first optical path system. However, this feature is not essential to the present invention. For example, the perforating operations using the first optical path system and the second optical path system respectively may be performed repeatedly for several number of pulses. Furthermore, the ratio of the periods over which the respective optical path systems are used may be changed as needed in accordance with the status of the processing or the precision of the hole shape etc.

Although the above description of the embodiment has been directed mainly to perforation processing applied to a ceramic green sheet or the like and a process of manufacturing a circuit board using the processing, the application of the processing according to the present invention is not limited to them. Objects to be processed may be articles made of various materials such as metals or resins or articles including multiple layers of these materials. Application of the present invention is not limited to a perforation process, but it may also be applied to various process, such as a cutting process or a pattern modification process, in which an improvement in processing speed or processing precision can be expected by selectively using a laser beam having a relatively high intensity and a laser beam that has been shaped.

By carrying out the present invention, it is possible to perform processing such as perforation on a ceramic green sheet or the like while using a laser beam efficiently. In addition, by using laser beams having different beam shapes as desired, it is possible to improve the processing efficiency in processing a work piece having a surface made of a material that is hard to process, and a desired processed shape can be easily obtained.

The invention claimed is:

1. A laser processing apparatus for irradiating a work piece with a laser beam to process the irradiated portion comprising:
   a laser oscillator for generating said laser beam with a predetermined pulse;
   an irradiation position control optical system for causing said laser beam to irradiate a predetermined position on said work piece;
   a plurality of optical path systems for guiding the laser beam emitted from said laser oscillator to said irradiation position controlling optical system; and
   a total reflection mirror as an optical path switch, which is capable of proceeding into and retracting from an optical path, for determining which optical path system is used, from said plurality of optical path systems,
   wherein said plurality of optical path systems includes (1) at least a first optical path system that guides said laser beam emitted from said laser oscillator to said irradiation position control optical system without changing its energy distribution in the direction perpendicular to the optical axis of the laser beam and (2) a second optical path system that guides said laser beam emitted from said laser oscillator to said irradiation position control optical system while changing its energy distribution in the direction perpendicular to the optical axis of the laser beam, and
   said total reflection mirror moves into and retracts from the optical path during an off-time of the laser beam in the predetermined pulse of said laser oscillator such that said total reflection mirror begins being driven for the moving into and retracting from the optical path when the predetermined pulse of said laser beam changes to an off-state, and driving of said total reflection mirror for the moving into and retracting from the optical path is completed before the predetermined pulse of said laser beam changes to an on-state.

2. A laser processing apparatus for irradiating a work piece with a laser beam to process the irradiated portion comprising:
   a laser oscillator for generating said laser beam;
   an irradiation position control optical system for causing said laser beam to irradiate a predetermined position on said work piece; and
   a plurality of optical path systems for guiding the laser beam emitted from said laser oscillator to said irradiation position controlling optical system; and
   a total reflection mirror as an optical path switch, which is capable of proceeding into and retracting from an optical path, for determining which optical path system is used, from said plurality of optical path systems,
   wherein said plurality of optical path systems includes (1) at least a first optical path system that guides said laser beam emitted from said laser oscillator to said irradiation position control optical system without changing the energy intensity of the laser beam and (2) a second optical path system that changes the energy distribution in the direction perpendicular to the optical axis thereof by preventing a portion of the laser beam emitted from said laser oscillator from reaching said irradiation position control optical system, and
   said total reflection mirror moves into and retracts from the optical path during an off-time of the laser beam in the predetermined pulse of said laser oscillator such that said total reflection mirror begins being driven for the moving into and retracting from the optical path when the predetermined pulse of said laser beam changes to an off-state, and driving of said total reflection mirror for the moving into and retracting from the optical path is completed before the predetermined pulse of said laser beam changes to an on-state.

3. A laser processing apparatus according to claim 1 or 2, wherein the second optical path system that changes the energy distribution of said laser beam includes a mask that makes the energy distribution in the direction perpendicular to the optical axis of the laser beam substantially uniform.

4. A laser processing apparatus according to claim 3, wherein the second optical path system that changes the energy distribution of said laser beam includes a homogenizer that makes the energy distribution in the direction perpendicular to the optical axis of the laser beam substantially uniform.

5. A laser processing method for irradiating a work piece with a laser beam to process the irradiated portion, comprising:
   a first processing irradiating a predetermined position on said work piece with a laser beam emitted from a laser oscillator without changing its energy distribution in the direction perpendicular to the optical axis of said laser beam;

a laser beam switching a laser beam to be used after completing said first processing step, from said laser beam that is not changed in its energy distribution to a laser beam that is formed by changing the energy distribution in the direction perpendicular to the optical axis, of the laser beam emitted from said laser oscillator, by moving a total reflection mirror into and retracting said total reflection mirror from an optical path of said laser beam during an off-time of the laser beam in the predetermined pulse of said laser oscillator such that said total reflection mirror begins being driven for the moving into and retracting from the optical path when the predetermined pulse of said laser beam changes to an off-state, and driving of said total reflection mirror for the moving into and retracting from the optical path is completed before the predetermined pulse of said laser beam changes to an on-state; and a second processing performing irradiation with said laser beam that has been changed in the energy distribution onto said predetermined position on said work piece.

6. A method according to claim 5, wherein the energy intensity distribution of said laser beam that has been changed in the energy distribution guided onto said work piece is made uniform.

* * * * *